(12) United States Patent
Saeki et al.

(10) Patent No.: US 6,540,869 B2
(45) Date of Patent: Apr. 1, 2003

(54) SEMICONDUCTOR PROCESSING SYSTEM

(75) Inventors: Hiroaki Saeki, Nirasaki (JP); Yasushi Taniyama, Toyohashi (JP)

(73) Assignees: Tokyo Electron Limited, Tokyo (JP); Shinko Electric Co., Ltd., Tokyo (JP)

( * ) Notice: Subject to any disclaimer, the term of this patent is extended or adjusted under 35 U.S.C. 154(b) by 112 days.

(21) Appl. No.: 09/870,495

(22) Filed: Jun. 1, 2001

(65) Prior Publication Data
US 2001/0053324 A1 Dec. 20, 2001

(30) Foreign Application Priority Data
Jun. 2, 2000 (JP) ........................................ 2000-165432

(51) Int. Cl.[7] ........................... C23F 1/00; H01L 21/306
(52) U.S. Cl. ............. 156/345.31; 118/719; 156/345.32; 414/217; 414/939
(58) Field of Search .................... 118/719; 414/217, 414/939; 156/345.31, 345.32

(56) References Cited

U.S. PATENT DOCUMENTS

| | | | | |
|---|---|---|---|---|
| 4,547,247 A | * | 10/1985 | Warenback et al. | .... 156/345.51 |
| 4,825,808 A | * | 5/1989 | Takahashi et al. | ........... 118/719 |
| 4,927,484 A | * | 5/1990 | Mitomi | ................. 156/345.32 |
| 4,941,429 A | * | 7/1990 | Wilkinson et al. | ........... 118/715 |
| 5,417,537 A | * | 5/1995 | Miller | ......................... 414/217 |
| 5,671,764 A | * | 9/1997 | Murakami et al. | .......... 134/200 |
| 5,700,127 A | * | 12/1997 | Harada et al. | .......... 414/416.08 |
| 6,215,897 B1 | * | 4/2001 | Beer et al. | .................. 382/151 |
| 6,270,619 B1 | * | 8/2001 | Suzuki et al. | .......... 156/345.22 |

FOREIGN PATENT DOCUMENTS

| WO | WO 00/30156 | 5/2000 |
|---|---|---|
| WO | WO 01/08211 | 2/2001 |

* cited by examiner

Primary Examiner—Gregory Mills
Assistant Examiner—Karla Moore
(74) Attorney, Agent, or Firm—Oblon, Spivak, McClelland, Maier & Neustadt, P.C.

(57) ABSTRACT

A semiconductor processing system comprises a first vacuum processing unit and a second vacuum processing unit connected thereto. The first and second vacuum processing units respectively comprise I/O transfer chambers. Casings of the transfer chambers are connected to each other, and a common transfer robot is arranged in the casings. The transfer robot is moved along horizontal guide rails and formed by connecting rails of the transfer chambers. A rail adjusting mechanism is provided to obtain linearity of the horizontal rails.

16 Claims, 11 Drawing Sheets

SEMICONDUCTOR PROCESSING SYSTEM

CROSS-REFERENCE TO RELATED APPLICATIONS

This application is based upon and claims the benefit of priority from the prior Japanese Patent Application No. 2000-165432, filed Jun. 2, 2000, the entire contents of which are incorporated herein by reference.

BACKGROUND OF THE INVENTION

The present invention relates to a semiconductor processing system, and more particularly to a structural improvement for connecting an additional functional section to a vacuum processing section for performing a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In a conventional typical semiconductor processing system, vacuum processing units are individually completed. In other words, a vacuum unit for performing a first processing step or steps is independent of a vacuum unit for performing a second processing step or steps. When a small number of wafers, such as trial products, which need a large number of processing steps are produced, a plurality of, for example, two vacuum processing units may be required. In this case, wafers that have been processed in a first vacuum processing unit are transferred to a second vacuum processing unit by a driverless cart. For this reason, the following problems occur.

Unless processing of all wafers is completed in the first vacuum processing unit, the wafers cannot be transferred to the second vacuum processing unit. In addition, the wafers that have been processed in the first vacuum processing unit must be transferred to the second vacuum processing unit by a driverless cart. Therefore, it takes a long period of time to perform the predetermine processing for all wafers. Particularly, in the case of producing a small number of semiconductors, such as trial products, since a large number of steps are required, the work efficiency as a whole is lowered.

Further, it takes a relatively long period of time to transfer wafers between the first and second vacuum processing units by a driverless cart. During this period, if the wafers under processing are left in the first vacuum processing unit for a long time, the wafers may become contaminated or oxidized. Furthermore, since the driverless cart must be maintained and inspected periodically, it requires a considerable cost including an initial investment.

Based on the above conventional art, International Application WO 00/30135 discloses a semiconductor processing system, in which atmosphere-side transfer chambers of first and second vacuum processing units are connected to each other. In this semiconductor processing system, a transfer robot common to the first and second vacuum processing units is moved between the atmosphere-side chambers of both processing units. The transfer robot moves along rails laid in the atmosphere-side chambers to transfer a wafer between the first and second vacuum processing units.

In the above semiconductor processing system, various problems occur in the connecting portion between the atmosphere-side transfer chambers of the first and second vacuum processing units. Firstly, the atmosphere-side transfer chambers tend to cause a displacement at the connecting portion due to an error that may occur in fabrication, or any load that may be applied to the chambers after they are connected. Secondly, even if the connecting ends of the casings of the atmosphere-side transfer chambers are aligned with each other, the connecting ends of the rails inside the chambers may be displaced. If such a problem occurs, the transfer robot cannot be moved smoothly along the rails but may be vibrated. In this case, particles may be generated, or the wafer may be out of position or even dropped from the robot. Further, if the airtightness of the atmospheric transfer chambers is impaired, the wafer may be contaminated while it is transferred between the atmosphere-side transfer chambers of the first and second vacuum processing units.

BRIEF SUMMARY OF THE INVENTION

An object of the present invention is to provide a semiconductor processing system in which a target substrate is smoothly transferred by a common transfer robot between two transfer chambers connected to each other.

Another object of the present invention is to provide a semiconductor processing system in which a target substrate is protected from dust or contamination, when it is transferred by a common transfer robot between two transfer chambers connected to each other.

According to a first aspect of the present invention, there is provided a semiconductor processing system comprising:

a first transfer chamber including a first casing having a plurality of ports which allow passage of a target substrate;

a first vacuum processing section connected to the first transfer chamber and having a first vacuum processing chamber configured to process the substrate in a vacuum atmosphere;

a first load port device, connected to the first transfer chamber, and configured to assist transfer of the substrate between the semiconductor processing system and a position outside the system;

a second transfer chamber detachably connected to the first transfer chamber and including a second casing having a plurality of ports which allow passage of the substrate, the second transfer chamber containing an internal atmosphere substantially in common with the first transfer chamber;

an additional functional section connected to the second transfer chamber, the additional functional section being selected from the group consisting of a second vacuum processing section and a second load port device, the second vacuum processing section having a second vacuum processing chamber configured to process the substrate in the vacuum atmosphere, and the second load port device being configured to assist transfer of the substrate between the semiconductor processing system and a position outside the system;

a transfer robot configured to transfer the substrate in the first and second transfer chambers;

first and second rails, respectively attached to the first and second casings in the first and second transfer chambers, and configured to form a track on which the transfer robot travels, the first and second rails constituting in association a horizontal rail integrally extending over the first and second transfer chambers;

a connecting and fixing mechanism configured to connect and fix the first and second casings to each other; and first and second base plates respectively attached to the first and second casings and respectively supporting the first and second rails, a connecting position of the first and second rails and a connecting position of the first and second base plates being out of alignment with each other in a longitudinal direction of the horizontal rail.

According to a second aspect of the present invention, there is provided a semiconductor processing system comprising:

a first transfer chamber including a first casing having a plurality of ports which allow passage of a target substrate;

a first vacuum processing section connected to the first transfer chamber and having a first vacuum processing chamber configured to process the substrate in a vacuum atmosphere;

a first load port device, connected to the first transfer chamber, and configured to assist transfer of the substrate between the semiconductor processing system and a position outside the system;

a second transfer chamber detachably connected to the first transfer chamber and including a second casing having a plurality of ports which allow passage of the substrate, the second transfer chamber containing an internal atmosphere substantially in common with the first transfer chamber;

an additional functional section connected to the second transfer chamber, the additional functional section being selected from the group consisting of a second vacuum processing section and a second load port device, the second vacuum processing section having a second vacuum processing chamber configured to process the substrate in the vacuum atmosphere, and the second load port device being configured to assist transfer of the substrate between the semiconductor processing system and a position outside the system;

a transfer robot configured to transfer the substrate in the first and second transfer chambers;

first and second rails, respectively attached to the first and second casings in the first and second transfer chambers, and configured to form a track on which the transfer robot travels, the first and second rails constituting in association a horizontal rail integrally extending over the first and second transfer chambers;

a connecting and fixing mechanism configured to connect and fix the first and second casings to each other; and a rail adjusting mechanism, interposed between the second casing and the second rail, and configured to adjust a position of the second rail relative to the second casing in a horizontal direction and a vertical direction substantially perpendicular to the longitudinal direction of the horizontal rail in order to obtain linearity of the horizontal rail between the first and second rails.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described with reference to the accompanying drawings. In the following description, elements having substan-tially the same function and structure are identified by the same reference symbol. An explanation of such elements will be repeated only when it is necessary.

Figure 1:
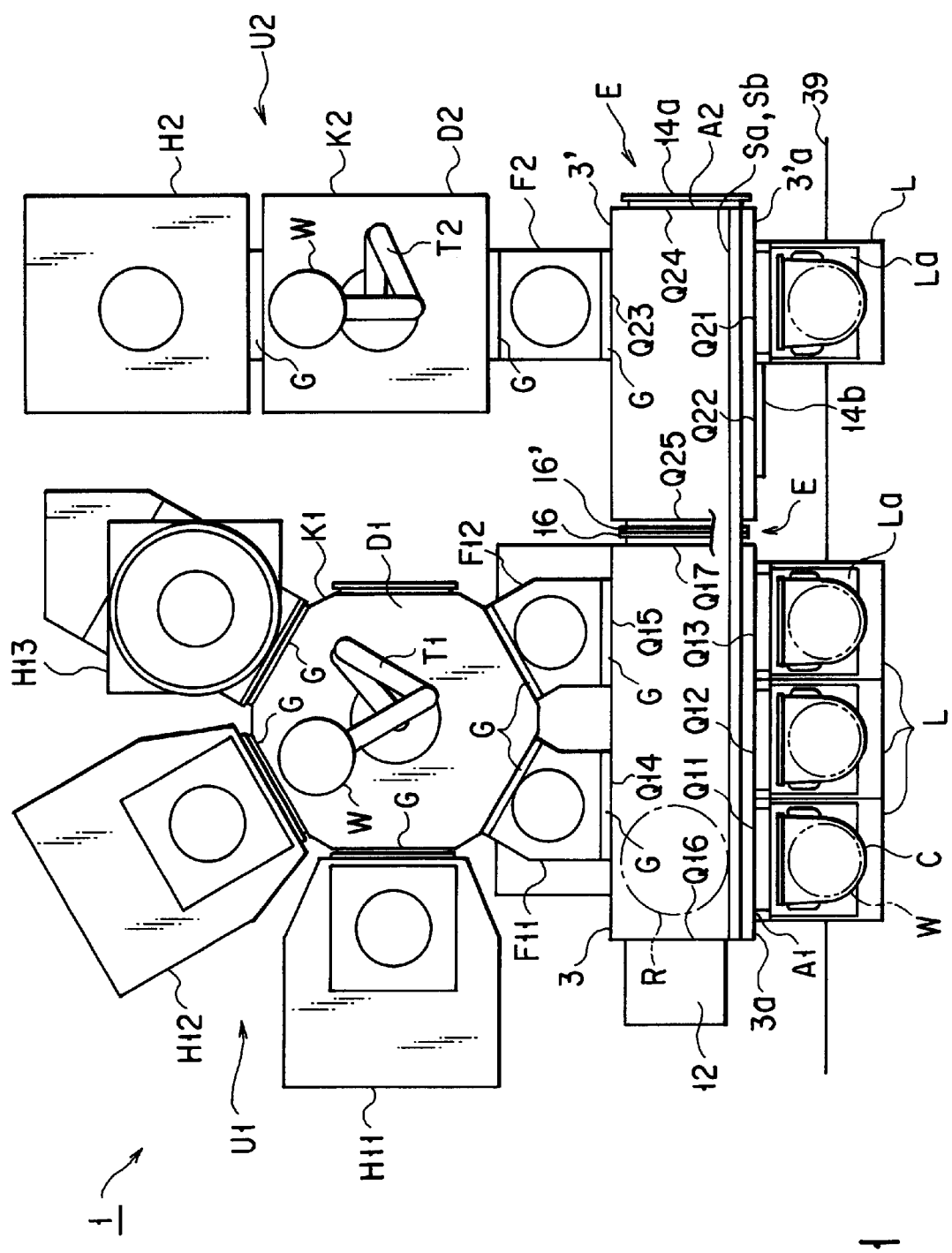
FIG. 1 is a plan view showing a semiconductor processing system according to an embodiment of the present invention.

FIG. 1 is a plan view showing a semiconductor processing system according to an embodiment of the present invention. As shown in the drawing, a semiconductor processing system 1 comprises a first vacuum processing unit U1 and a second vacuum processing unit U2 connected thereto. The first vacuum processing unit U1 includes an I/O transfer chamber A1, three load port devices L and a vacuum processing section K1. The second vacuum processing unit U2 includes an I/O transfer chamber A2, a load port device L and a vacuum processing section K2. The second vacuum processing unit U2 is provided to connect, to the first vacuum processing unit U1, additional functional sections, such as the load port device L and/or a vacuum process-ing chamber H2 of the vacuum processing section K2.

The I/O transfer chamber A1 of the first vacuum processing unit U1 comprises a casing 3 having a plurality of ports Q11 to Q17 which allow passage of a wafer W. The I/O transfer chamber A2 of the second vacuum processing unit U2 comprises a casing 31 having a plurality of ports Q21 to Q25 which allow passage of the wafer W. The adjacent end ports (extension ports) Q17 and Q25 of the I/O transfer chambers A1 and A2 are detachably connected to each other, in the manner as will be described later. The other end port Q16 of the transfer chamber A1 is connected to an orienter 12 for determining the direction of a wafer w based on an orientation flat or notch formed on the wafer W. The other end port (extension port) Q24 of the transfer chamber A2 is not used in this embodiment, and closed airtightly by a blind flange 14a.

The end ports Q17 and Q25 of the transfer chambers A1 and A2 are connected airtightly by a connection fixing mechanism, such as connecting bolts 18, and a packing 17 (see FIGS. 3A and 3B), thereby constituting an airtight structure. The transfer chambers A1 and A2 contain a common internal atmosphere, which is set to a pressure substantially the same as or higher than that of an ambient atmosphere of a space (normally, a clean room) surrounding the semiconductor processing system 1. Since the transfer chambers A1 and A2 have a positive pressure with respect to the ambient atmosphere, the transfer chambers A1 and A2 can be protected from intrusion of contaminants. The internal atmosphere of the transfer chambers A1 and A2 is constituted by a gas selected from the group consisting of clean air and nitrogen.

The four load port devices L have substantially the same structure, and respectively connected to the load-side ports Q11 to Q13 and Q21 of the I/O transfer chambers A1 and A2. Another load-side port Q22 of the transfer chamber A2, to which a load port device L can be connected, is not used in this embodiment, but closed airtightly by a blind flange 14b. The load port devices L are used to assist transfer of the wafer W between the semiconductor processing system 1 and a position outside the system 1. For this purpose, each of the load port devices L has a table La, which is detachably loaded with a wafer cassette C containing a plurality of wafers W, and performs positioning of the cassette.

The vacuum processing section K1 of the first vacuum processing unit U1 comprises a vacuum transfer chamber D1, and two load lock chambers F11 and F12 and three vacuum processing chambers H11 to H13 connected to the vacuum transfer chamber D1 via gate valves G. The vacuum transfer chamber D1 can be set to a vacuum atmosphere by a pressurizing and depressurizing mechanism (not shown). The vacuum transfer chamber D1 incorporates a transfer device T1, which transfers the wafer W among the load lock chambers F11 and F12 and the vacuum processing chambers H11 to H13. The load lock chambers F11 and F12 are connected to the process-side ports Q14 and Q15 of the I/O transfer chamber A1 via gate valves G. The load lock chambers F11 and F12 can also be set to the vacuum atmosphere by the pressurizing and depressurizing mechanism (not shown). The vacuum processing chambers H11 to H13 are constructed to process the wafer W in the vacuum atmosphere. For example, an etching process is performed in each of the processing chambers H11 and H12, and a film-forming process is performed in the processing chamber H13.

The vacuum processing section K2 of the second vacuum processing unit U2 comprises a vacuum transfer chamber D2, and a load lock chamber F2 and a vacuum processing chamber H2 connected to the vacuum transfer chamber D2 by gate valves G. The vacuum transfer chamber D2 can be set to the vacuum atmosphere by the pressurizing and depressurizing mechanism (not shown).

The vacuum transfer chamber D2 incorporates a transfer device T2, which transfers the wafer W between the load lock chamber F2 and the vacuum processing chamber H2. The load lock chamber F2 is connected to the process-side port Q23 of the I/O transfer chamber A2 via a gate valve G. The load lock chamber F2 can also be set to the vacuum atmosphere by the pressurizing and depressurizing mechanism (not shown). The vacuum processing chamber H2 is constructed to process the wafer W, for example, to perform an ashing process, in the vacuum atmosphere.

A transfer robot R for transferring the wafer W is located in the I/O transfer chambers A1 and A2. The transfer robot R is driven by a linear motor and travels along a pair of upper and lower horizontal guide rails Sa and Sb laid on one side of the transfer chambers A1 and A2. Each of the upper and lower horizontal rails Sa and Sb is constituted by rails 6 and 6' (FIGS. 3A and 3B) respectively laid in the transfer chambers A1 and A2 and aligned with each other in one straight line.

The wafer W is processed in the above semiconductor processing system 1 in accordance with the following flow. First, the wafer W to be processed is taken out from one of the wafer cassettes C mounted on the three load port devices L of the first vacuum processing unit U1. It is then transferred into the load lock chamber F11. Thereafter, the wafer W is taken out from the load lock chamber F11 by the transfer device Ti in the vacuum transfer chamber D1 and transferred into the vacuum processing chamber H11, and subjected to an etching process therein. The wafer W that has been processed in the vacuum processing chamber H11 is taken out by the transfer device T1, then transferred into the vacuum processing chamber H12, and subjected therein to another etching process. The wafer W that has been processed in the vacuum processing chamber H12 is taken out by the transfer device T1 and transferred into the load lock chamber F12.

After the processes in the first vacuum processing unit U1 are completed, the wafer w is then taken out from the load lock chamber F12 by the transfer robot R and transferred to the second vacuum processing unit U2 through the I/O transfer chambers A1 and A2. In the second vacuum processing unit U2, the wafer W is transferred into the load lock chamber F2 by the transfer robot R. Then the wafer w is taken out from the load lock chamber F2 by the transfer device T2 of the vacuum transfer chamber D2, then transferred into the vacuum processing chamber H2, and subjected to an ashing process therein. The wafer W that has been processed in the vacuum processing chamber H2 is taken out by the transfer device T2 and transferred into the load lock chamber F2. The wafer W is then taken out from the load lock chamber F2 by the transfer robot R, and inserted in the wafer cassette C disposed in the load port device L of the second vacuum processing unit U2.

Figure 2:
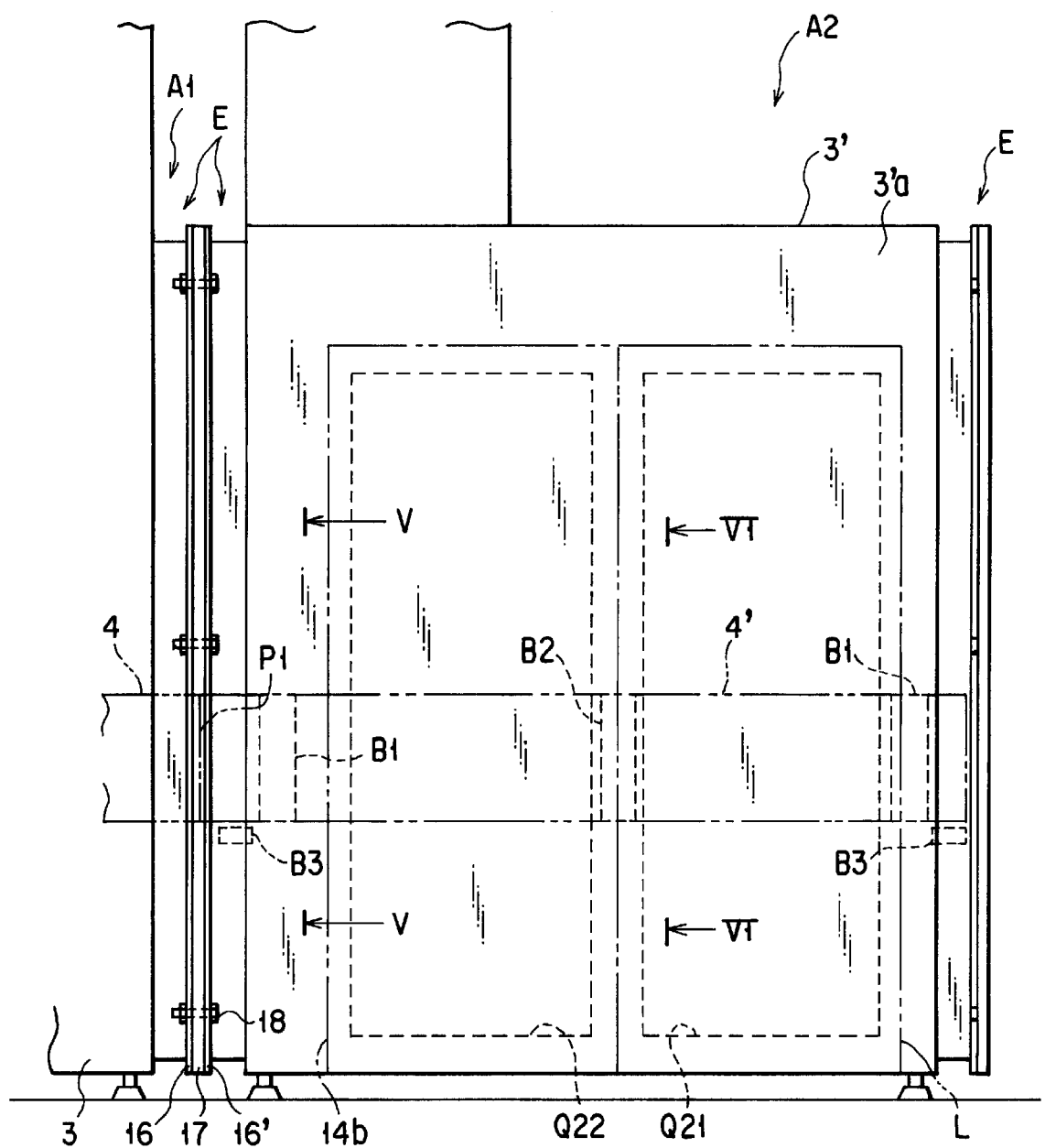
FIG. 2 is a front view of an I/O transfer chamber of a second vacuum processing unit of the system shown in FIG. 1.
Figure 3:
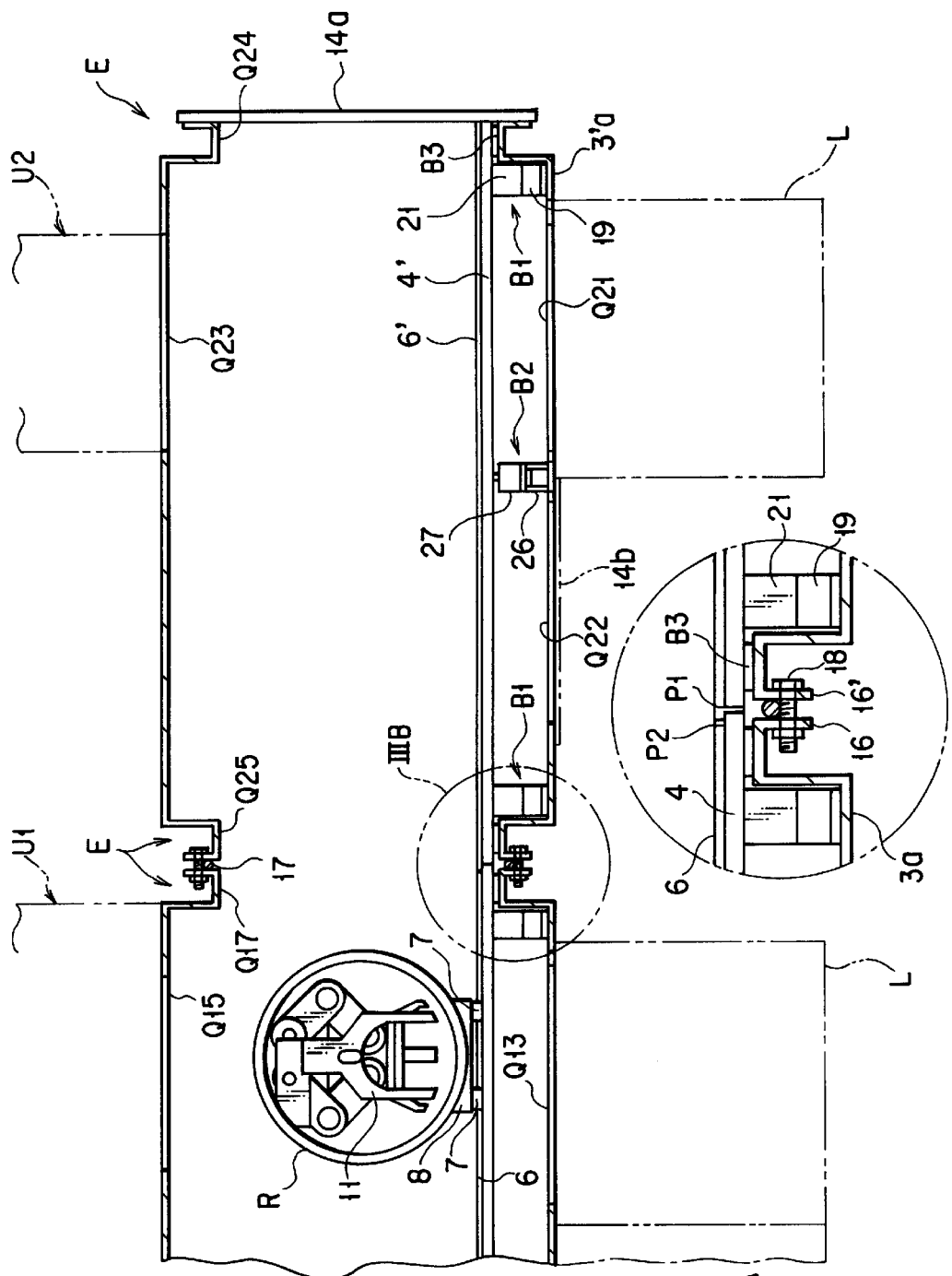
FIG. 3A is a cross-sectional plan view showing the transfer chamber shown in FIG. 2 along with a part of an I/O transfer chamber of a first vacuum processing unit.
FIG. 3B is a n enlarged view of the portion IIIB in FIG. 3A.
Figure 4:
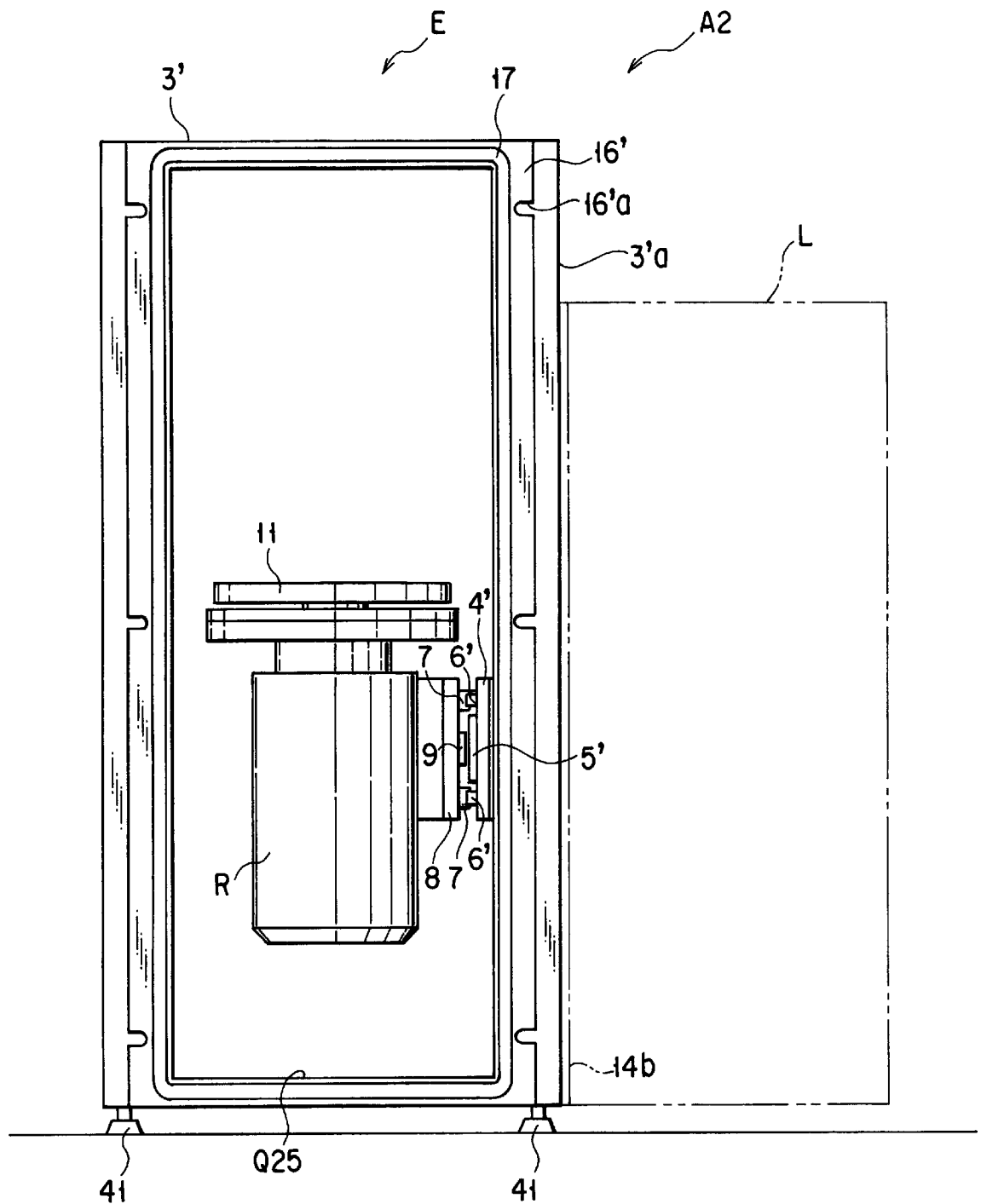
FIG. 4 is a side view of the I/O transfer chamber shown in FIG. 2.

Details of the I/O transfer chambers A1 and A2 will now be described. FIGS. 2, 3A and 4 are respectively a plan view, a cross-sectional plan view and a side view of the I/O transfer chambers A1 and A2.

Figure 5:
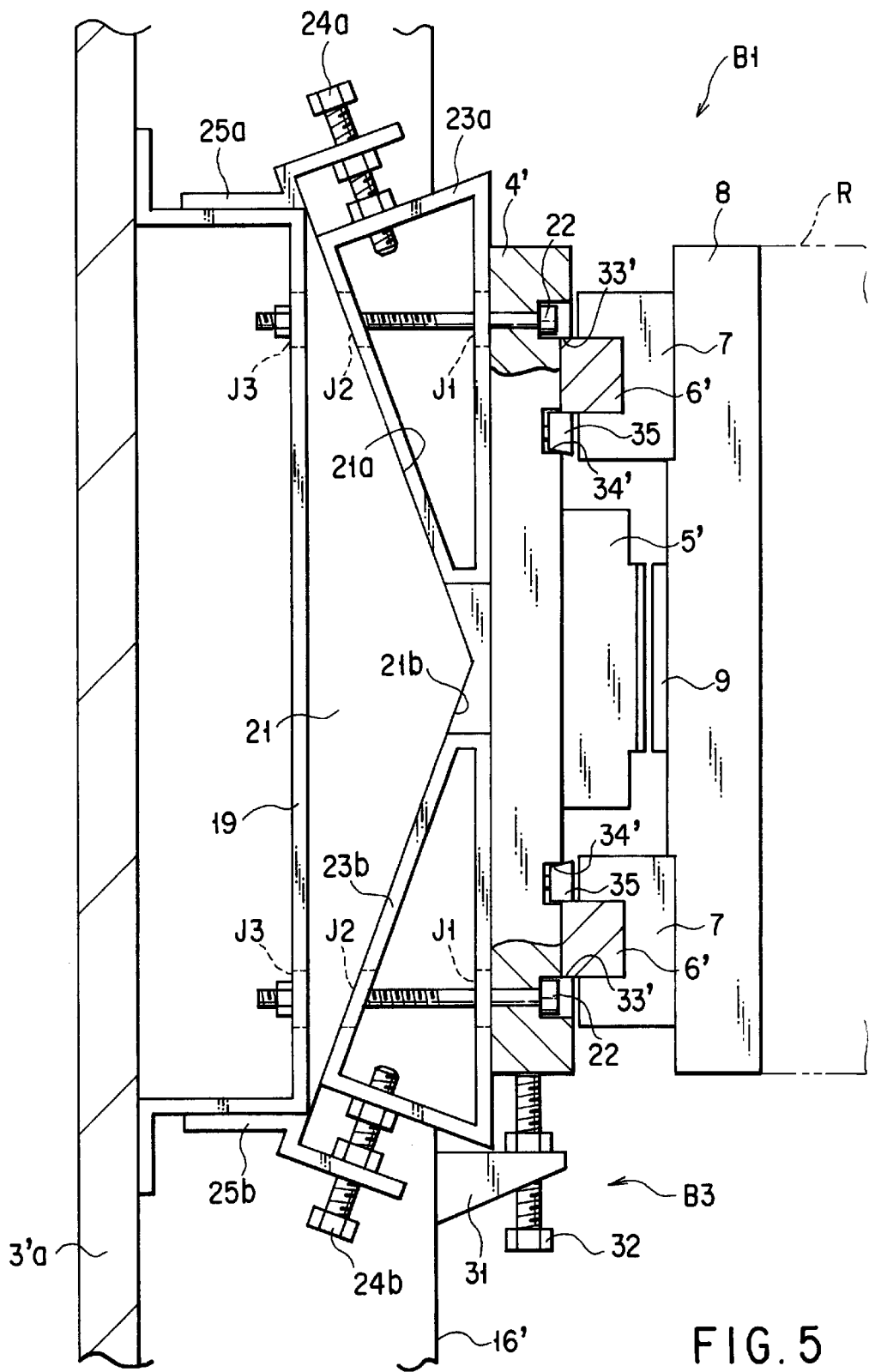
FIG. 5 is a cross-sectional view taken along the line V—V in FIG. 2.
Figure 6:
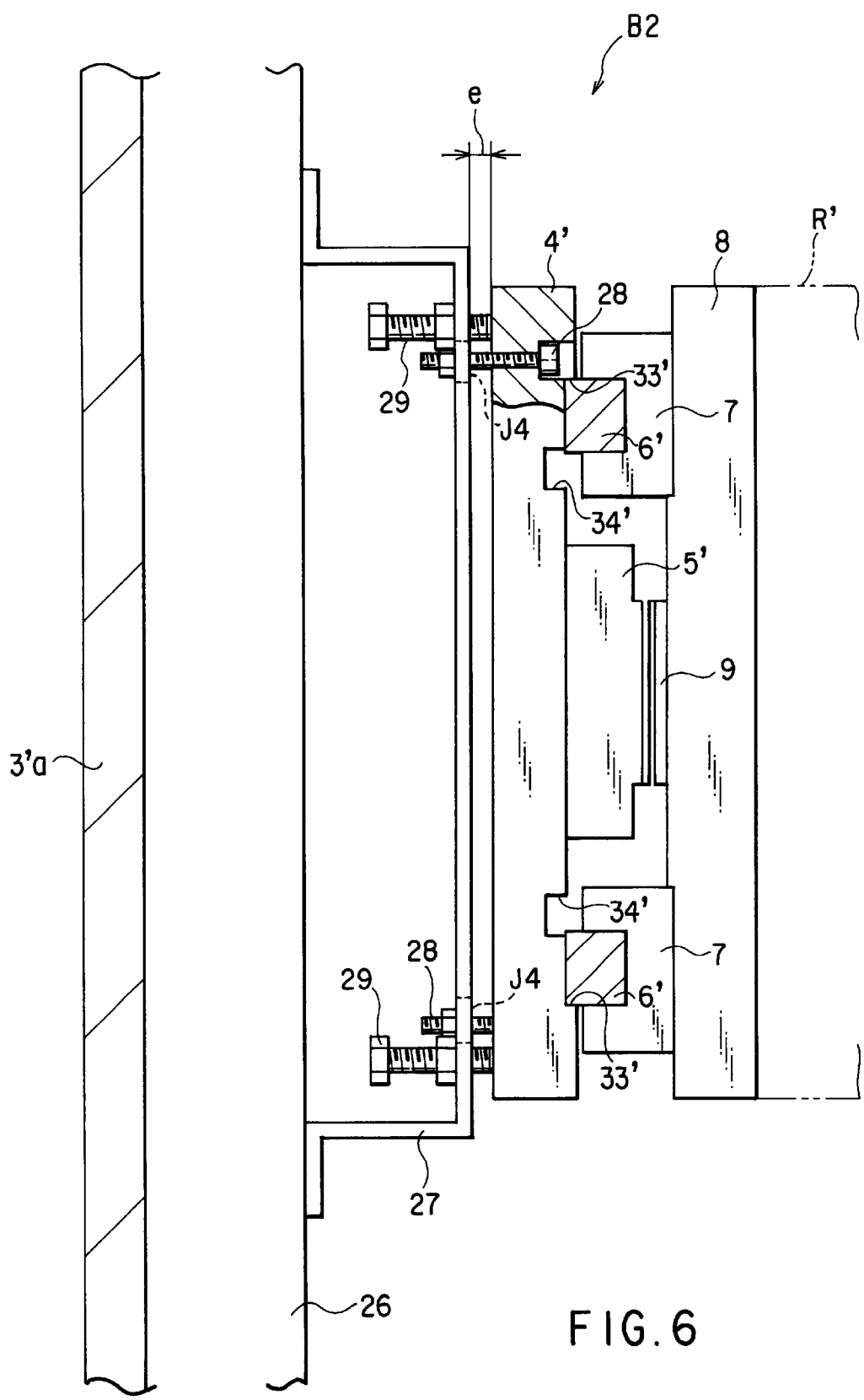
FIG. 6 is a cross-sectional view taken along the line VI—VI in FIG. 2.

FIG. 3B is an enlarged view of the portion IIIB in FIG. 3A. FIGS. 5 and 6 are cross-sectional views taken along the lines V—V and VI—VI in FIG. 2. A member of the transfer chamber A2 having the same function as the corresponding member of the transfer chamber A1 is identified by the same symbol as that of the transfer chamber A1 with an apostrophe ('). The structures of the transfer chambers A1 and A2 will be described first below, and then an operation, for connecting the transfer chambers A1 and A2 to connect the second vacuum processing unit U2 to the existing first vacuum processing unit U1, will be described.

The transfer chamber A1 of the first vacuum processing unit U1 comprises the casing 3, which is box-shaped. A plurality of (in this embodiment, three) load port devices L are connected to the outer side of a front wall 3a. A base plate 4, extending along the longitudinal direction of the transfer chamber A1, is mounted on the inner side of the front wall 3a of the casing 3. A secondary-side stator 5 of a linear motor M is attached to the base plate 4. The pair of upper and lower guide rails 6 are attached horizontally to the base plate 4. A robot base 8 for supporting the transfer robot R is mounted on guide blocks 7 attached to the rails 6. A primary-side mover 9 of the linear motor M is attached to that portion of the robot base 8 which faces the secondary-side stator 5 of the linear motor M.

With the above-described structure, when the linear motor M is driven, the transfer robot R is guided by the pair of rails 6 and reciprocated along the longitudinal direction of the casing 3. The transfer robot R, having a transfer fork 11 provided on its upper surface, takes out the wafers W one by one from the wafer cassette C and holding the same. In this state, the transfer robot R moves horizontally, and transfers the wafer to a predetermined position.

An end portion of the wall of the casing 3, on which the end port (extension port) Q17 is formed, has a connecting portion E to be connected to the casing 3' of the transfer chamber A2. The structure of the connecting portion E of the transfer chamber A1 is not described now, since it is the same as that of a connecting portion E of the transfer chamber A2 described later.

The transfer chamber A2 of the second vacuum processing unit U2 is connected to the transfer chamber A1 to provide an additional functional section, such as a processing section and/or a load port device. Various sizes of chambers are prepared for the transfer chamber A2. In this embodiment, the transfer chamber A2 can connect two load ports L and one vacuum processing section K2 to the transfer chamber A1. The load port device L is connected to a front wall 3'a of the box-shaped casing 3' constituting the transfer chamber A2. The vacuum processing section K2 is connected to a back wall thereof. End ports (extension ports) Q24 and Q25 having connecting portions E, which can be connected to the casing 3 of the transfer chamber A1, are formed at both end portions of the casing 3'. In this embodiment, the end port Q24 and the load-side port Q22 of the transfer chamber A2 are closed by the blind flanges 14a and 14b.

As shown in FIGS. 3A, 3B and 4, the end ports Q24 and Q25 formed at the ends of the casing 3' (also the end port Q17 of the casing 3) have a size that allows passage of the transfer robot R holding the wafer W. A flange 16' having a substantially L-shaped cross section is fixed to an edge of the opening of the end port Q25. Packing 17 is attached to the overall periphery of the flange 16'. U-shaped cut portions 16'a, through which connecting bolts 18 are inserted, are formed in the flange 16' at predetermined intervals in the vertical direction.

As shown in FIGS. 2, 3A and 3B, a base plate 4' is attached to the inner side of the front wall 3'a of the casing 3' so as to be parallel to the front wall 3'a. The base plate 4' is attached to the casing 3' by a rail adjusting mechanism. Likewise, the base plate 4 of the transfer chamber A1 is attached to the casing 3 by a rail adjusting mechanism. To align the horizontal rails Sa and Sb (FIG. 1) constituted by the rails 6 and 6' of the transfer chambers A1 and A2, these rail adjusting mechanisms can adjust the relative positions of the rails 6 and 6' with respect to the casings 3 and 3' in the vertical direction and the horizontal direction substantially perpendicular to the longitudinal direction of the horizontal rails Sa and Sb. Since the rail adjusting mechanisms of the transfer chambers A1 and A2 are basically the same, the additional transfer chamber A2, which essentially requires the rail adjusting mechanism, will be described below in detail. The base plate 4' is supported by first and second position adjusting devices B1 and B2 for fine adjustment of the position thereof in the thickness direction (the depth direction of the casing 3') and height adjusting devices B3 for fine adjustment of the position thereof in the vertical direction. The first position adjusting devices B1 are mounted on both ends in the longitudinal direction of the casing 3'. The second position adjusting device B2 is mounted on the substantially central portion in the longitudinal direction of the casing 3'. The height adjusting devices B3 are mounted on the inner sides of the flanges 16' in the connecting portions E.

The first position adjusting device B1 includes a triangle base 21 attached to a bracket 19 fixed to the inner side of the front wall 3'a of the casing 3, as shown in FIGS. 3A, 3B and 5. The triangle base 21 has a substantially isosceles triangular cross section. The base plate 4' is fixed by two fastening bolts 22 in front of upper and lower inclined surfaces 21a and 21b of the triangle base 21. Wedge members 23a and 23b are inserted in upper and lower gaps between the base plate 4'and the inclined surfaces 21a and 21b. Each of the wedge members 23a and 23b has an angle corresponding to the angle of the gap. The wedge members 23a and 23b are in surface contact with the inclined surfaces 21a and 21b and the base plate 4'.

The wedge members 23a and 23b have slits J1 and J2 corresponding to the fastening bolts 22. Each slit is elongated in the vertical direction. Therefore, the wedge members 23a and 23b are movable up and down in the gaps. Adjusting bolts 24a and 24b are attached-to the upper surface of the wedge member 23a and the lower surface of the wedge member 23b by brackets 25a and 25b, respectively. The adjusting bolts 24a and 24b can be moved individually to exactly adjust the position of the base plate 4'. In the state where the fastening bolts 22 for fixing the base plate 4' are provisionally fastened, the wedge members 23a and 23b are moved up and down by adjusting the degree of fastening the adjustment bolts 24a and 24b. As a result, the attachment position and angle of the base plate 4' can be exactly adjusted.

The second position adjusting device B2 includes a support 26 mounted on the inner side of the front wall 3'a in the central portion along the longitudinal direction of the casing 3', as shown in FIGS. 2, 3A, 3B and 6. A bracket 27 is fixed to the support 26 at substantially the same height as that of the bracket 19 of the first position adjusting device B1. The base plate 4' is attached to the bracket 27 by fastening bolts 28 with a gap e (FIG. 6) left therebetween. Pushing bolts 29 for pushing the base place 4' are screwed into the bracket 27.

The base plate 4' is fixed by the fastening bolts 28 and the pushing bolts 29 by means of pushing and pulling forces of the bolts. The attachment position and angle of the base plate 4' can be exactly adjusted by adjusting the degree of fastening of the fastening bolts 28 and the pushing bolts 29. In other words, the attachment position of a pair of guide rails 6' can be exactly adjusted in the depth direction of the casing 3'. Since the base plate 4' is long, if the attachment position and angle are adjusted only at both ends thereof by the first position adjusting devices B1, the attachment position and angle at the central portion may be deviated from the required values. However, according to the embodiment of the present invention, the attachment position and angle of the base plate 4' in the central portion thereof can be exactly adjusted. Therefore, the position and angle of the base plate 4' throughout its length can be adjusted with high accuracy.

The height adjusting device B3 includes, as shown in FIGS. 2, 3A, 3B and 5, a bracket 31 fixed to the inner side of the flange 16' in each connecting portion E of the casing 3'. A height adjusting bolt 32 is screwed into a top end portion of the bracket 31 along the vertical direction. The height adjusting bolt 32 is located just under the base plate 4' to support it. The bracket 19 has slits J3 elongated in the vertical direction at the positions corresponding to the fastening bolts 22 of the first position adjusting devices B1. Likewise, the bracket 27 has slits J4 elongated in the vertical direction at the positions corresponding to the fastening bolts 28 of the second position adjusting device B2. Thus, the base plate 4' can be moved up and down by rotation of the height adjusting bolt 32.

Figure 7:
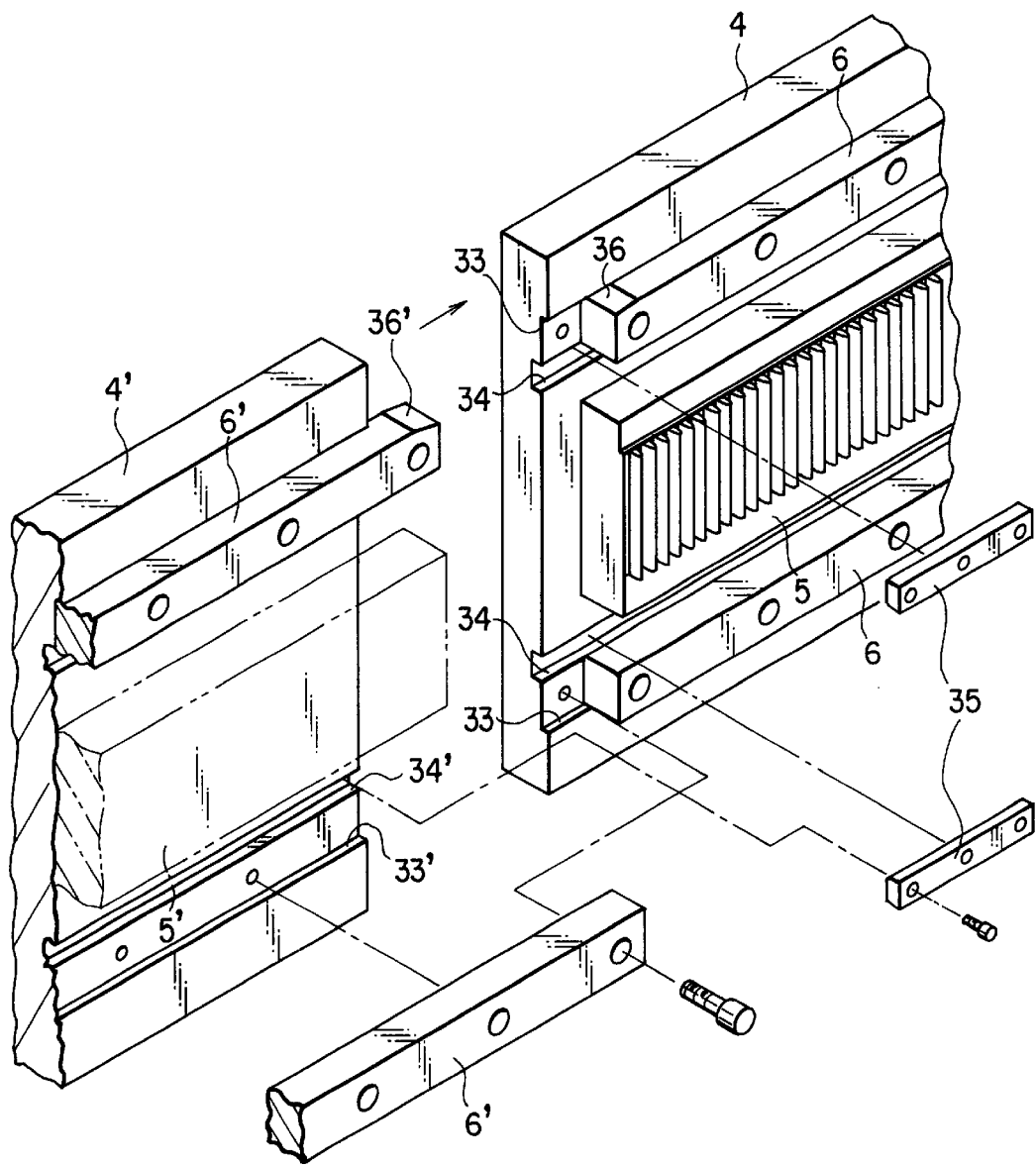
FIG. 7 is a perspective view showing a state where rails of the I/O transfer chambers of the first and second vacuum processing units of the system shown in FIG. 1 are to be connected.
Figure 8:
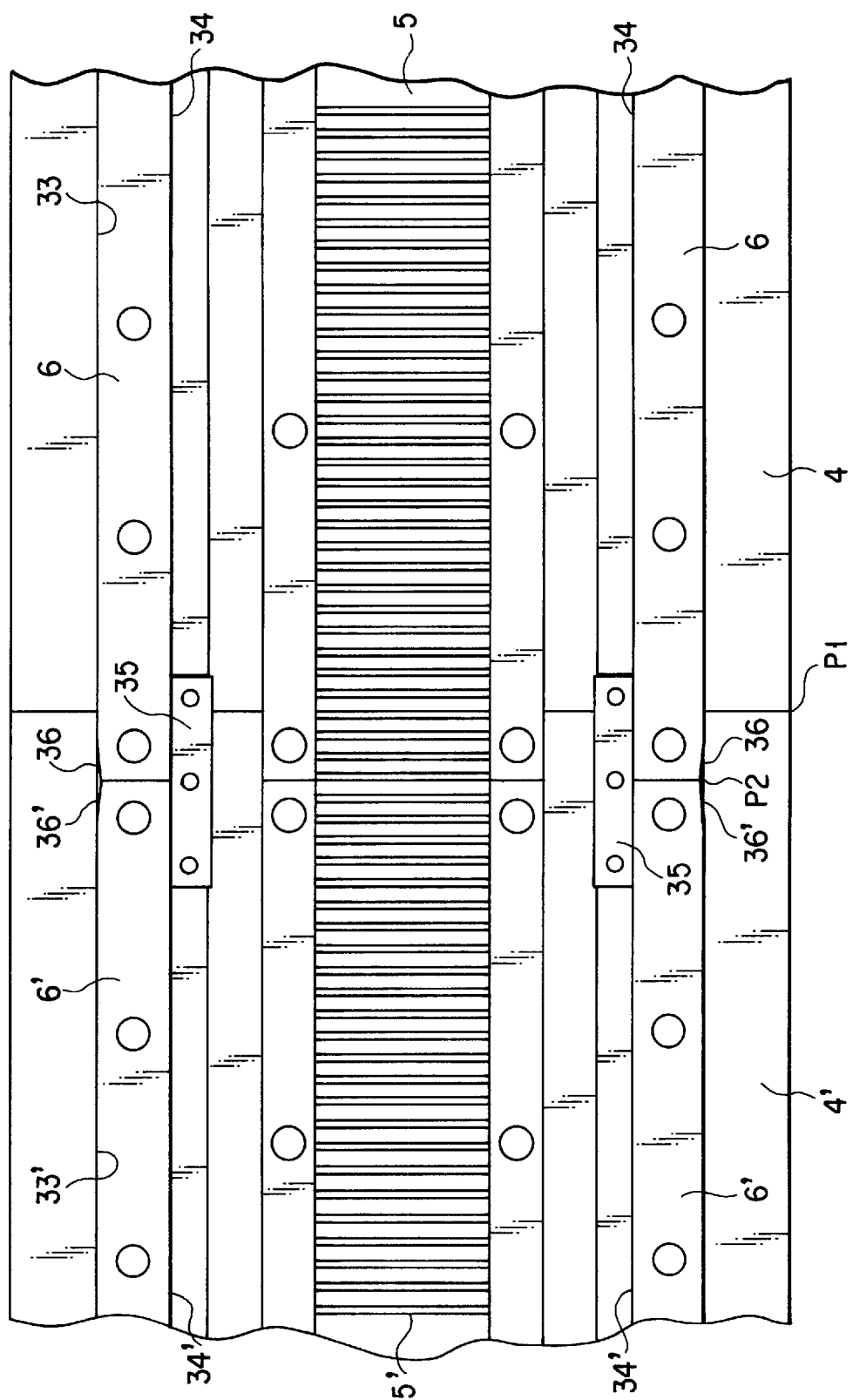
FIG. 8 is a plan view of the state shown in FIG. 7.

FIG. 7 is a perspective view showing the state where the rails 6 and 6' laid in both I/O transfer chambers A1 and A2 are to be connected. FIG. 8 is a plan view of the state shown in FIG. 7. As shown in FIGS. 7 and 8, the pair of upper and lower rails 6 are attached horizontally to the base plate 4, and the pair of upper and lower rails 6' are attached horizontally to the base plate 4'. Step portions 33 (33') are formed in upper and lower portions of the base plate 4 (4') along the longitudinal direction of the base plate 4 (4'). The upper side of the upper rail 6 (6') and the lower side of the rail 6 (6') are respectively brought into contact with the upper and lower step portions 33 (33'). Grooves 34 (34') are formed under the upper step portion 33 (33') and above the lower step portion 33 (33') along the longitudinal direction of the base plate 4 (4').

As shown in FIG. 7, when the base plates 4 and 4' are connected to each other, connecting plates 35 are fitted to the upper and lower grooves 34 and 34'. One side of each connecting plate 35 (the side which is brought into contact with the rail 6 or 6') is perpendicular to the front surface of the connecting plate and the opposite side is tapered. In addition, the maximum width of each connecting plate 35 is wider than the inner width of the groove 34 or 34'. Therefore, the pair of rails 6 and 6' are firmly pressed against the step portions 33 and 33' of the base plates 4 and 4' by the sides of the connecting plates 35.

The secondary stators 5 and 5' of the linear motor M are attached horizontally to the base plates 4 and 4' substantially at the center thereof in the vertical direction. When the base plates 4 and 4' are connected to each other, the pair of rails 6' and the secondary stator 5' of the transfer chamber A2 are attached to the inner surface of the base plate 4 of the transfer chamber A1 so as to overlap it. Therefore, a connecting position P1 of the base plates 4 and 4' (the position between the facing ends of the base plates) is out of alignment with a connecting position P2 of the pair of rails 6 and 6' (the position between the facing ends of the rails) in the longitudinal direction of the base plates. Therefore, while the transfer robot R is traveling along the rails, the vibration thereof is dispersed at the connecting positions P1 and P2. Thus, the vibration can be suppressed to the minimum. In addition, tapered clearance portions 36 and 36' are formed in the end portions of the rails 6 and 6'. Therefore, even if a little error occurs when the rails 6 and 6' are connected to each other, the transfer robot R will not be caught by the rails 6 and 6'.

Figure 9:
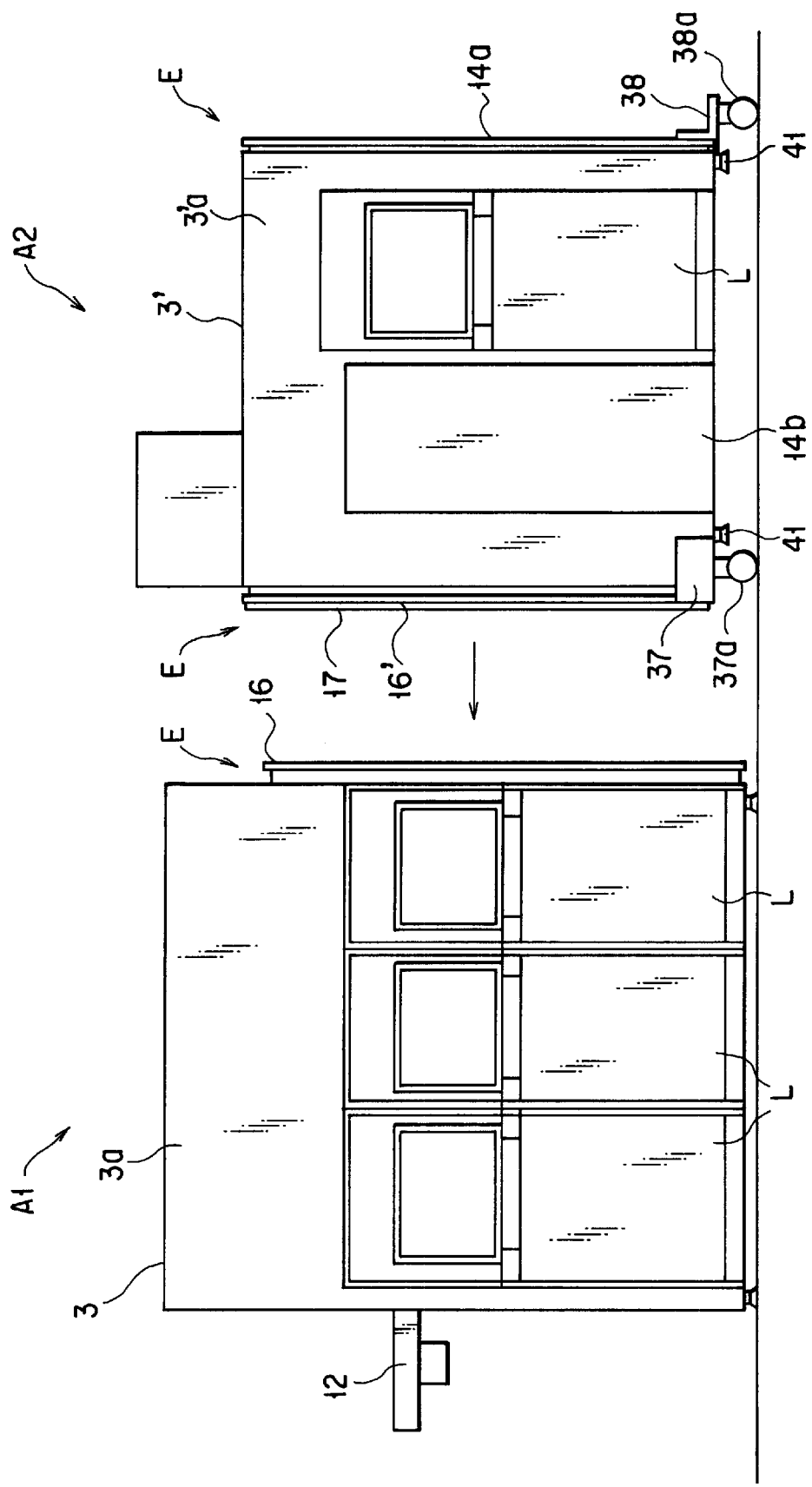
FIG. 9 is a side view showing a state where the I/O transfer chamber of the second vacuum processing unit is to be connected to the I/O transfer chamber of the first vacuum processing unit in the system shown in FIG. 1.
Figure 10:
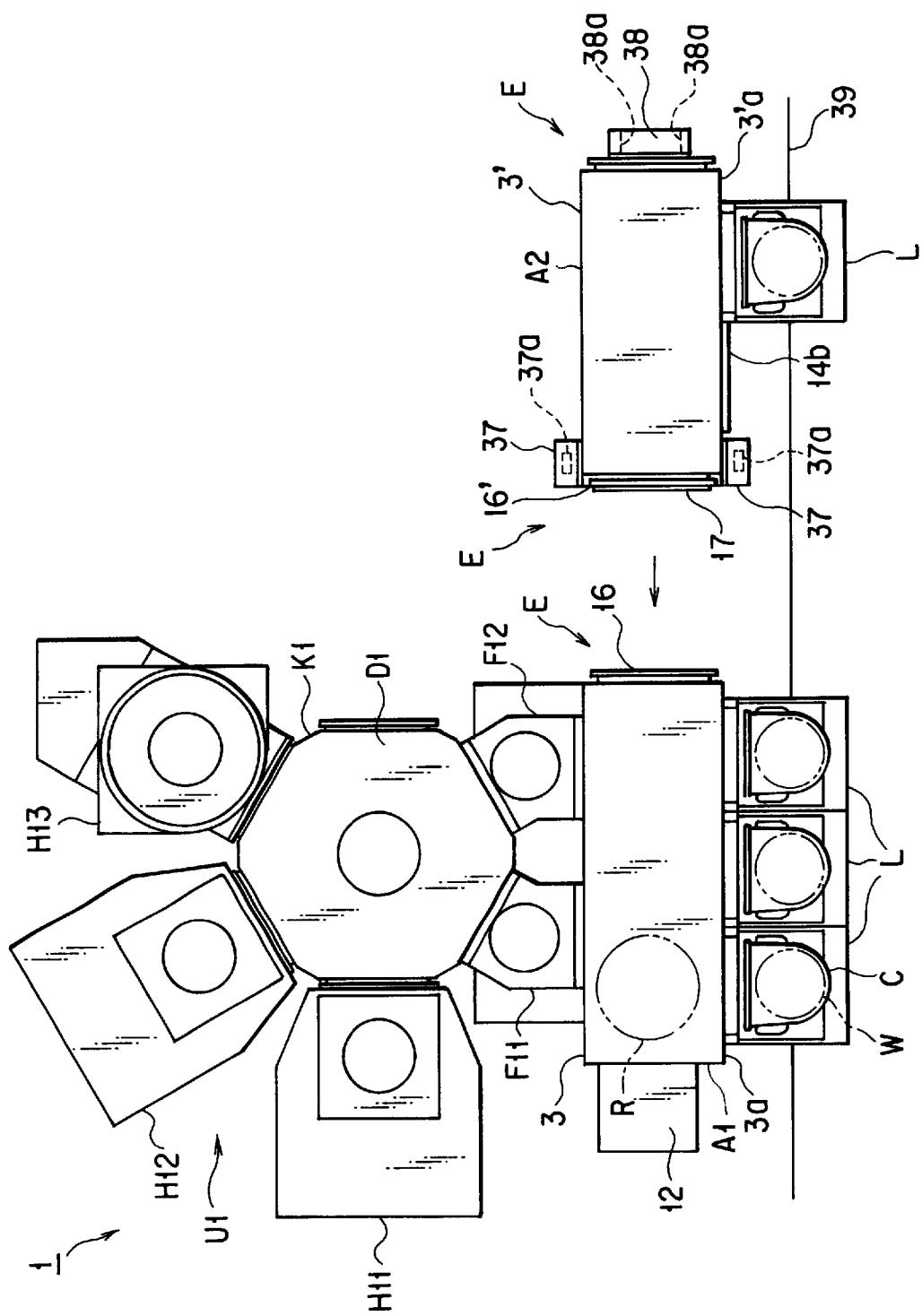
FIG. 10 is a plan view of the state shown in FIG. 9.
Figure 11:
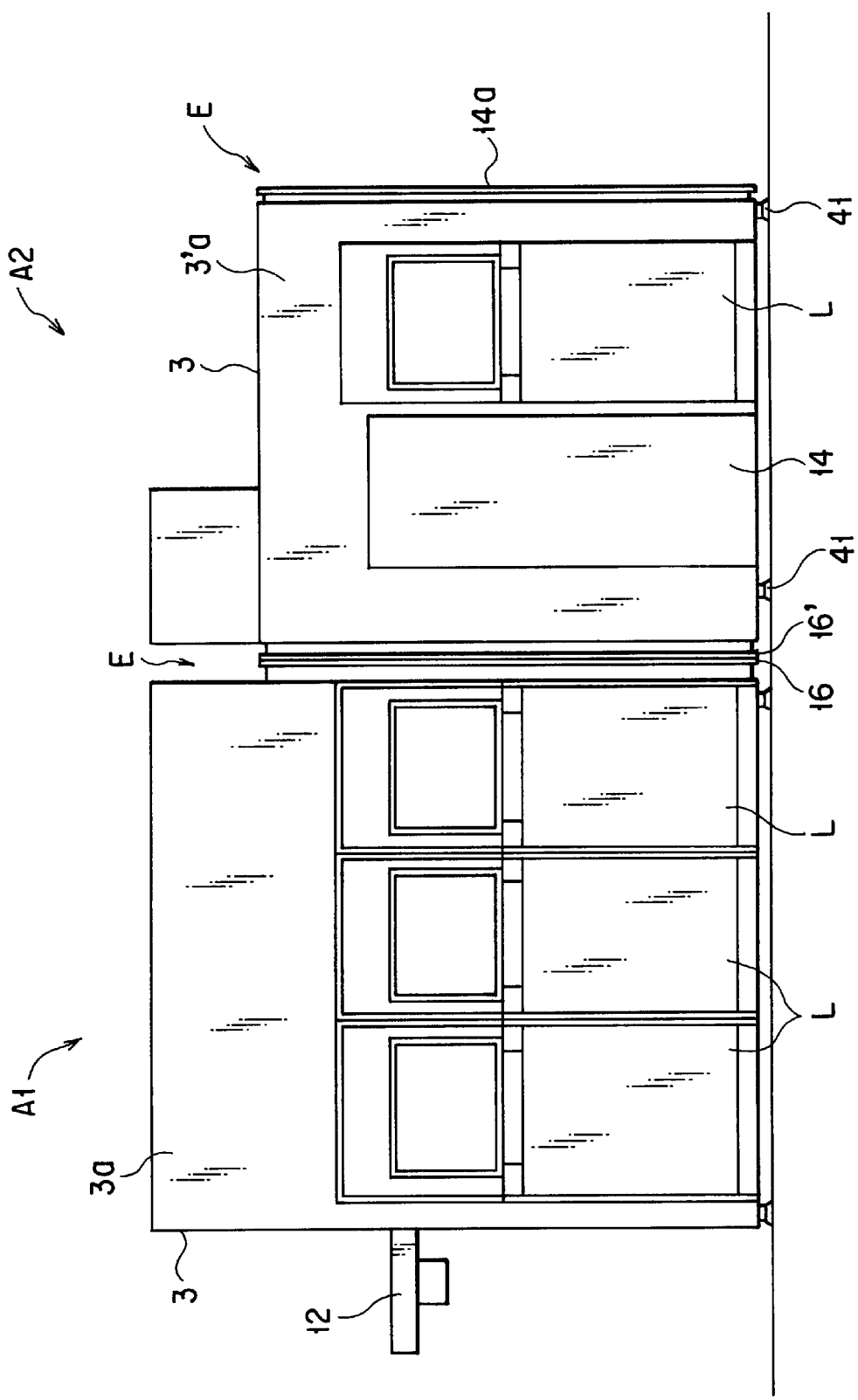
FIG. 11 is a side view showing a state in which the connecting operation shown in FIG. 9 is completed.

An operation, for connecting the transfer chambers A1 and A2 in the case where the second vacuum processing unit U2 is connected to the existing first vacuum processing unit U1, will now be described. FIG. 9 is a side view showing a state where the transfer chamber A2 of the second vacuum processing unit U2 is to be connected to the transfer chamber A1 of the first vacuum processing unit U1. FIG. 10 is a plan view of the state shown in FIG. 9. FIG. 11 is a side view showing a state in which the connecting operation shown in FIG. 9 is completed.

As shown in FIGS. 9 and 10, first, casters 37a and 38a are attached to the bottom of the transfer chamber A2 via transfer jigs 37 and 38, so that the transfer chamber A2 can be moved easily. The transfer chamber A2 is moved along an OHT (Over Head Transport) line 39 (FIG. 10) and placed near the transfer chamber A1. The OHT line is a reference line used when the transfer chamber A2 is disposed, and parallel to a line along which the transfer robot R linearly reciprocates. The transfer chamber A2 is subjected to height adjustment and leveling by means of adjuster feet 41. Thereafter, the connecting portions E of the transfer chambers A1 and A2 are connected. Since the flanges 16 and 16' of the casings 3 and 3' are fastened to each other with the packing 17 interposed therebetween, the connecting portions E are connected airtightly.

Then, the base plate 4 of the transfer chamber A1 and the base plate 4' of the transfer chamber A2 are connected. The degree of fastening the height adjusting bolt 32 of the height adjusting device B3 is adjusted so that the height of the base plate 4' of the transfer chamber A2 coincides with the height of the base plate 4 of the transfer chamber A1. Thereafter, adjustment for connecting the upper and lower rails 6 and 6' is carried out. More specifically, the degrees of fastening the adjusting bolts 24a and 24b of the first position adjusting devices B1 are adjusted. At the same time, the degrees of fastening the fastening bolts 28 and the pushing bolts 29 of the second position adjusting device B2 are adjusted. Thus, the attachment position and angle of the base plates 4 and 4' are adjusted, thereby exactly adjusting the linearity of the pair of upper and lower horizontal guide rails Sa and Sb (FIG. 1) constituted by the rails 6 and 6'.

The upper and lower rails 6' of the transfer chamber A2 are attached to the inner surface of the base plate 4 of the transfer chamber A1 so as to overlap it. Therefore, the connecting position P1 of the base plates 4 and 4' does not correspond to the connecting positions P2 of the pair of rails 6 and 6' along the longitudinal direction of the horizontal rails Sa and Sb. Therefore, the vibration at the connecting positions P1 and P2 can be dispersed, with the result that the vibration exerted on the robot R can be suppressed to the minimum.

Thereafter, the connecting plates 35 are engaged with the grooves 34 and 34'. The connecting plates 35 strongly press the sides of the rails 6 and 6' near the connecting positions P2. Therefore, the linearity of the horizontal rails Sa and Sb is not deteriorated at the connecting positions P2 between the rails 6 and 6', when the transfer robot R is traveling.

Then, the secondary stator 5 of the transfer chamber A1 and the secondary stator 51 of the transfer chamber A2 are connected. The secondary stator 5' of the transfer chamber A2 is also attached to the inner surface of the base plate 4 of the transfer chamber A1 so as to overlap it. Therefore, the rigidity of the base plates 4 and 4' at the connecting position P1 is increased. As a result, the rails 6 of the transfer chamber A1 are connected to the rails 6' of the transfer chamber A2, while the linearity of the horizontal rails Sa and Sb is maintained. Therefore, the transfer robot R can travel along the rails over the transfer chambers A1 and A2 without vibration.

The connecting portions of the transfer chambers A1 and A2 are kept airtight by the packing 17. The common internal atmosphere in the transfer chambers A1 and A2 is set to a pressure substantially the same as or higher than that of an ambient atmosphere of a space (normally, a clean room) surrounding the semiconductor processing system 1. Since the transfer chambers A1 and A2 have a positive pressure with respect to the ambient atmosphere, the transfer chambers A1 and A2 can be protected from intrusion of contaminants. The internal atmosphere of the transfer chambers A1 and A2 is constituted by a gas selected from the group consisting of clean air and nitrogen. Thus, since the transfer chambers A1 and A2 serve as one integral transfer chamber, it is unnecessary to use wafer transfer equipment, such as a driverless cart.

The casing 3' of the transfer chamber A2 also has a connecting portion E on the side of the end port (extension port) Q24. Therefore, another vacuum processing unit (not shown) can be additionally connected to the end port Q24. The transfer chamber A2 can be easily disconnected from the transfer chamber A1 by performing the connecting operations described above in reverse order.

The transfer chambers A1 and A2 may comprise vacuum casings, which can be evacuated. In this case, an evacuation section and a gas supply section may be connected to at least one of the casings 3 and 3' of the transfer chambers A1 and A2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing system comprising:
    a first transfer chamber including a first casing having a plurality of ports which allow passage of a target substrate;
    a first vacuum processing section connected to the first transfer chamber and having a first vacuum processing chamber configured to process the substrate in a vacuum atmosphere;
    a first load port device, connected to the first transfer chamber, and configured to assist transfer of the substrate between the semiconductor processing system and a position outside the system;
    a second transfer chamber detachably connected to the first transfer chamber and including a second casing having a plurality of ports which allow passage of the substrate, the second transfer chamber containing an internal atmosphere substantially in common with the first transfer chamber;
    an additional functional section connected to the second transfer chamber, the additional functional section being selected from the group consisting of a second vacuum processing section and a second load port device, the second vacuum processing section having a second vacuum processing chamber configured to process the substrate in the vacuum atmosphere, and the second load port device being configured to assist transfer of the substrate between the semiconductor processing system and a position outside the system;
    a transfer robot configured to transfer the substrate in the first and second transfer chambers;
    first and second rails, respectively attached to the first and second casings in the first and second transfer chambers, and configured to form a track on which the transfer robot travels, the first and second rails constituting in association a horizontal rail integrally extending over the first and second transfer chambers;
    a connecting and fixing mechanism configured to connect and fix the first and second casings to each other; and
    first and second base plates respectively attached to the first and second casings and respectively supporting the first and second rails, a connecting position of the first and second rails and a connecting position of the first and second base plates being out of alignment with each other in a longitudinal direction of the horizontal rail.

2. The system according to claim 1, wherein the first and second base plates are connected by a connecting plate extending over opposing ends of the first and second base plates and fixed to the first and second base plates.

3. The system according to claim 2, wherein the connecting plate presses the first and second rails in a vertical direction against first and second surfaces of the first and second base plates.

4. The system according to claim 1, wherein opposing ends of the first and second rails are tapered.

5. The system according to claim 1, further comprising a rail adjusting mechanism, interposed between the second casing and the second base plate, and configured to adjust a position of the second rail relative to the second casing in a horizontal direction and a vertical direction substantially perpendicular to the longitudinal direction of the horizontal rail in order to obtain linearity of the horizontal rail between the first and second rails.

6. The system according to claim 5, wherein the rail adjusting mechanism comprises first and second wedge members inserted between the second casing and the second base plate respectively from two opposite directions, and first and second inclined surfaces attached to the second base plate and brought into surface contact with the first and second wedge members.

7. The system according to claim 5, further comprising another rail adjusting mechanism interposed between the first casing and the first base plate and having a substantially equivalent structure as that of the rail adjusting mechanism.

8. The system according to claim 1, wherein the horizontal rail comprises a pair of upper and lower rails laid parallel to each other on the first and second base plates.

9. The system according to claim 1, wherein the transfer robot is driven by a linear motor along the horizontal rail.

10. The system according to claim 1, wherein the first and second transfer chambers have an airtight structure containing an internal atmosphere set to a pressure substantially same as or greater than that of a space surrounding the semiconductor processing system.

11. The system according to claim 10, wherein the internal atmosphere of the first and second transfer chambers comprises a gas selected from the group consisting of clean air and nitrogen.

12. The system according to claim 10, wherein the first vacuum processing section comprises a first load lock chamber, which is connected to the first transfer chamber and is capable of being set to a vacuum atmosphere, a vacuum transfer chamber, which connects the first load lock chamber and the first vacuum processing chamber to each other and is capable of being set to a vacuum atmosphere, and a transfer device, which is disposed in the vacuum transfer chamber and is configured to transfer the substrate between the first load lock chamber and the first vacuum processing chamber.

13. A semiconductor processing system comprising:
- a first transfer chamber including a first casing having a plurality of ports which allow passage of a target substrate;
- a first vacuum processing section connected to the first transfer chamber and having a first vacuum processing chamber configured to process the substrate in a vacuum atmosphere;
- a first load port device, connected to the first transfer chamber, and configured to assist transfer of the substrate between the semiconductor processing system and a position outside the system;
- a second transfer chamber detachably connected to the first transfer chamber and including a second casing having a plurality of ports which allow passage of the substrate, the second transfer chamber containing an internal atmosphere substantially in common with the first transfer chamber;
- an additional functional section connected to the second transfer chamber, the additional functional section being selected from the group consisting of a second vacuum processing section and a second load port device, the second vacuum processing section having a second vacuum processing chamber configured to process the substrate in the vacuum atmosphere, and the second load port device being configured to assist transfer of the substrate between the semiconductor processing system and a position outside the system;
- a transfer robot configured to transfer the substrate in the first and second transfer chambers;
- first and second rails, respectively attached to the first and second casings in the first and second transfer chambers, and configured to form a track on which the transfer robot travels, the first and second rails constituting in association a horizontal rail integrally extending over the first and second transfer chambers;
- a connecting and fixing mechanism configured to connect and fix the first and second casings to each other; and
- a rail adjusting mechanism, interposed between the second casing and the second rail, and configured to adjust a position of the second rail relative to the second casing in a horizontal direction and a vertical direction substantially perpendicular to the longitudinal direction of the horizontal rail in order to obtain linearity of the horizontal rail between the first and second rails.

14. The system according to claim 13, wherein the rail adjusting mechanism comprises first and second wedge members inserted between the second casing and the second rail respectively from two opposite directions, and first and second inclined surfaces brought into surface contact with the first and second wedge members.

15. The system according to claim 13, further comprising a second base plate supporting the second rail and attached to the second casing via the rail adjusting mechanism, the second rail comprising a pair of upper and lower rails laid parallel to each other on the second base plate.

16. The system according to claim 13, further comprising another rail adjusting mechanism interposed between the first casing and the first rail and having a substantially equivalent structure as that of the rail adjusting mechanism.

* * * * *